(12) United States Patent
Kanegae

(10) Patent No.: US 6,664,181 B2
(45) Date of Patent: Dec. 16, 2003

(54) METHOD FOR FABRICATING SEMICONDUCTOR DEVICE

(75) Inventor: Kenshi Kanegae, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 8 days.

(21) Appl. No.: 10/307,309

(22) Filed: Dec. 2, 2002

(65) Prior Publication Data

US 2003/0119240 A1 Jun. 26, 2003

(30) Foreign Application Priority Data

Dec. 7, 2001 (JP) ........................................ 2001-374656

(51) Int. Cl.[7] .......................................... H01L 21/4763
(52) U.S. Cl. ........................................ 438/637; 438/725
(58) Field of Search ................................. 438/637, 639, 438/645, 671, 672, 700, 724, 725

(56) References Cited

U.S. PATENT DOCUMENTS 6,255,216 B1 * 7/2001 Doan et al.

FOREIGN PATENT DOCUMENTS

| JP | 10-125774 | 5/1998 |
| JP | 11-154703 | 6/1999 |

* cited by examiner

Primary Examiner—Phuc T. Dang
(74) Attorney, Agent, or Firm—McDermott, Will & Emery

(57) ABSTRACT

A peeling film is deposited on an insulating film, which is formed on a semiconductor substrate and has a hole, and on the bottom and the wall of the hole so as not to fill the hole with the peeling film. A resist film is formed over the peeling film so as to fill the hole. A resist pattern is formed by patterning the resist film so as to form an interconnect groove opening around the hole and to allow a portion of the resist film to remain within the hole. The peeling film and the insulating film are etched by using the resist pattern as a mask, so as to form an interconnect groove continuous with the hole in the insulating film. After removing the resist pattern, a remaining portion of the peeling film is removed.

24 Claims, 15 Drawing Sheets

METHOD FOR FABRICATING SEMICONDUCTOR DEVICE

BACKGROUND OF THE INVENTION

The present invention relates to a method for fabricating a semiconductor device, and more particularly, it relates to a method for forming a hole and an interconnect groove respectively for use in forming a plug and a buried interconnect by a dual damascene method.

Recently, there are increasing demands for attaining high performance and refinement of semiconductor integrated circuit devices. Therefore, as a method for increasing the information transfer rate within a semiconductor integrated circuit and improving the reliability of interconnects included in the semiconductor integrated circuit, the dual damascene method using copper as an interconnect material attracts attention.

A method for forming a hole and an interconnect groove in an insulating film for use in forming a plug and a buried interconnect by the dual damascene method is roughly divided into two, one of which is trench-first process for forming the interconnect groove first and the other of which is hole-first process for forming the hole first.

Since a hole is formed after forming an interconnect groove in an insulating film in the trench-first process, it is necessary to perform lithography for forming the hole in a region of the insulating film where the interconnect groove has been formed. At this point, since a level difference derived from the interconnect groove has been caused in a resist film, when the resist film is subjected to pattern exposure for forming the hole, the focus is disadvantageously shifted and hence a fine hole pattern cannot be formed. Accordingly, the hole-first process is preferred for forming a fine hole.

Now, a first conventional method for forming a hole and an interconnect groove by the hole-first process will be described with reference to FIGS. 12A through 12C and 13A through 13C.

First, as shown in FIG. 12A, a lower interconnect 12 is formed in a first insulating film 11 deposited on a semiconductor substrate 10, and thereafter, a passivation film 13 for preventing corrosion of the lower interconnect 12 is formed from a silicon nitride film with a comparatively large thickness on the first insulating film 11. The passivation film 13 has a comparatively large thickness because the passivation film 13 works as an etching stopper in two etching procedures described later.

Next, after depositing a second insulating film 14 on the passivation film 13, a patterned antireflection film 15 and a first resist pattern 16 are formed on the second insulating film 14. Then, the second insulating film 14 is etched by using the first resist pattern 16 as a mask, so as to form a hole 17A in the second insulating film 14. In this etching procedure, the passivation film 13 works as the etching stopper. Thereafter, the first resist pattern 16 and etching residues are removed by ashing and wet cleaning.

Subsequently, as shown in FIG. 12B, a second resist pattern 18 is formed on the antireflection film 15.

Then, the second insulating film 14 is etched by using the second resist pattern 18 as a mask, so as to form an interconnect groove 17B in the second insulating film 14 as shown in FIG. 12C. Also in this etching procedure, the passivation film 13 works as the etching stopper. Thereafter, the second resist pattern 18 and etching residues are removed by the ashing, and the substrate is cleaned.

Next, as shown in FIG. 13A, the passivation film 13 is etched by using, as a mask, the second insulating film 14 in which the hole 17A and the interconnect groove 17B have been formed, so as to expose the lower interconnect 12.

Then, as shown in FIG. 13B, a metal film 19 is deposited on the second insulating film 14 so as to fill the hole 17A and the interconnect groove 17B, and a portion of the metal film 19 present above the second insulating film 14 is removed by, for example, CMP. Thus, a plug 19A and an upper interconnect 19B made from the metal film 19 are formed as shown in FIG. 13C.

Now, a second conventional method for forming a hole and an interconnect groove by the hole-first process will be described with reference to FIGS. 14A through 14C and 15A through 15C.

First, as shown in FIG. 14A, a lower interconnect 22 is formed in a first insulating film 21 deposited on a semiconductor substrate 20, and thereafter, a passivation film 23 for preventing corrosion of the lower interconnect 22 is formed from a silicon nitride film with a comparatively small thickness on the first insulating film 21. The passivation film 23 has a comparatively small thickness because the passivation film 23 works as an etching stopper in one etching procedure alone as described later. Then, after depositing a second insulating film 24 on the passivation film 23, a patterned antireflection film 25 and a first resist pattern 26 are formed on the second insulating film 24. Next, the second insulating film 24 is etched by using the first resist pattern 26 as a mask, so as to form a hole 27A in the second insulating film 24. In this etching procedure, the passivation film 23 works as the etching stopper. Thereafter, the first resist pattern 26 and etching residues are removed by the ashing, and the substrate is cleaned.

Next, as shown in FIG. 14B, a second resist pattern 28 is formed on the antireflection film 25, and an organic film 29 made of a resist material or an antireflection film material is buried in the hole 27A. At this point, in the case where the organic film 29 is made of a resist material, after forming a resist film on the antireflection film 25 so as to fill the hole 27A, the resist film is patterned, so that the organic film 29 can be buried in the hole 27A. Alternatively, in the case where the organic film 29 is made of an antireflection film material, after burying the organic film 29 in the hole 27A, a resist pattern is formed on the antireflection film 25, so that the organic film 29 can be buried in the hole 27A.

Next, the second insulating film 24 is etched by using the second resist pattern 28 as a mask, so as to form an interconnect groove 27B in the second insulating film 24 as shown in FIG. 14C. In this etching procedure, the organic film 29 protects the lower interconnect 22. Then, the second resist pattern 28, the organic film 29 and etching residues are removed by the ashing, and the substrate is cleaned.

Subsequently, as shown in FIG. 15A, the passivation film 23 is etched by using, as a mask, the second insulating film 24 in which the hole 27A and the interconnect groove 27B have been formed, so as to expose the lower interconnect 22.

Then, as shown in FIG. 15B, a metal film 31 is deposited on the second insulating film 24 so as to fill the hole 27A and the interconnect groove 27B, and a portion of the metal film 31 present above the second insulating film 24 is removed by, for example, the CMP. Thus, a plug 31A and an upper interconnect 31B made from the metal film 31 are formed as shown in FIG. 15C.

In the first conventional method, the passivation film 13 has a large thickness in order to prevent the lower interconnect 11 from being damaged during the two etching procedures as described above.

Therefore, the passivation film 13, which is made from a silicon nitride film with a large dielectric constant and has a large thickness, is provided between the lower interconnect 11 and the upper interconnect 19B as shown in FIG. 13C. Accordingly, interconnect capacitance between the lower interconnect 11 and the upper interconnect 19B is disadvantageously large, which can cause a problem of signal delay.

Furthermore, since the passivation film 13 is largely etched in the etching procedure for exposing the lower interconnect 11, a damage layer 12a is unavoidably formed in the lower interconnect 11 as shown in FIG. 13A, which disadvantageously spoils the reliability of the lower interconnect 11.

Moreover, since the passivation film 13 is largely etched in the etching procedure for exposing the lower interconnect 11, the interconnect groove 17B has a round shoulder in its uppermost wall as shown in FIG. 13A. When the interconnect groove 17B has a round shoulder in the uppermost wall, the metal film 19 filled in the round shoulder portion of the interconnect groove 17B may cause a short-circuit between adjacent interconnect grooves 19B.

On the other hand, in the second conventional method, the passivation film 13 has a small thickness and hence the above-described problems of the first conventional method can be avoided, but other problems as described below occur.

Since the organic film 29 is buried in the hole 27A as shown in FIG. 14B, a portion of the second insulating film 24 in contact with the organic film 29 is difficult to etch in the etching procedure for forming the interconnect groove 27B. Therefore, a fence 24a of the second insulating film 24 is formed between the hole 27A and the interconnect groove 27B as shown in FIG. 14C. Accordingly, a broken piece 32 of the fence 24a and a particle 33 of the organic film 29 are generated on the antireflection film 25 as shown in FIG. 15A. Therefore, when the plug 31A and the upper interconnect 31B are formed by removing the portion of the metal film 31 present above the second insulating film 24 by the CM1, a scratch 25a is caused on the top face of the antireflection film 25 as shown in FIG. 15C, which can disadvantageously cause disconnection of the upper interconnect 31B. Alternatively, when the metal film 31 remains in the scratch 25a, a short-circuit can be caused between adjacent upper interconnects 31B.

Furthermore, since the fence 24a is present between the hole 27A and the interconnect groove 27B, the metal film 31 is insufficiently filled. Accordingly, a void 33 is formed in the upper interconnect 31B as shown in FIGS. 15B and 15C, which can disadvantageously lowers the reliability of the upper interconnect 31B.

As described so far, although the fence of the insulating film is not formed between the hole and the interconnect groove in the first conventional method, the passivation film should have a large thickness. In contrast, although the passivation film may have a small thickness in the second conventional method, the fence of the insulating film is unavoidably formed between the hole and the interconnect groove.

SUMMARY OF THE INVENTION

In consideration of the aforementioned conventional problems, an object of the invention is, in a method for fabricating a semiconductor device including a step of forming an interconnect groove continuous with a hole in an insulating film after forming the hole in the insulating film, preventing a fence of the insulating film from being formed in a boundary between the hole and the interconnect groove even when a passivation film present at the bottom of the hole has a small thickness.

In order to achieve the object, the first method for fabricating a semiconductor device of this invention includes the steps of depositing a peeling film on an insulating film, which is formed on a semiconductor substrate and has a hole, and on a bottom and a wall of the hole in such a manner that the hole is not filled with the peeling film; forming a resist film over the peeling film in such a manner that the hole is filled with the resist film; forming a resist pattern from the resist film by patterning the resist film in such a manner that an interconnect groove opening is formed around the hole and that a portion of the resist film remains within the hole; forming an interconnect groove continuous with the hole in the insulating film by etching the peeling film and the insulating film with the resist pattern used as a mask; and removing a remaining portion of the peeling film after removing the resist pattern.

In the first method for fabricating a semiconductor device, since the resist pattern present within the hole protects a lower interconnect in etching for forming the interconnect groove, the thickness of a passivation film formed on the lower interconnect can be small. Accordingly, the interconnect capacitance between the lower interconnect and an upper interconnect can be reduced, the reliability of the lower interconnect can be improved because a damage layer is prevented from being formed in the lower interconnect, and the interconnect groove minimally has a round shoulder in its uppermost wall so as to avoid a short-circuit between adjacent upper interconnects.

Furthermore, a fence of the insulating film is not formed in a boundary between the hole and the interconnect groove, and the peeling film in which a fence has been formed is ultimately removed. Therefore, a broken piece of a fence is not generated and a metal film is definitely filled in the hole. As a result, the reliability of the upper interconnect can be improved.

The second method for fabricating a semiconductor device of this invention includes the steps of depositing a peeling film on an insulating film, which is formed on a semiconductor substrate and has a hole, and on a bottom and a wall of the hole in such a manner that the hole is not filled with the peeling film; forming an organic film on a portion of the peeling film within the hole; forming a resist pattern from a resist film, which is formed on the peeling film and the organic film, by patterning the resist film in such a manner that an interconnect groove opening is formed around the hole; forming an interconnect groove continuous with the hole in the insulating film by etching the peeling film and the insulating film with the resist pattern used as a mask; and removing a remaining portion of the peeling film after removing the resist pattern and the organic film.

In the second method for fabricating a semiconductor device, since the organic film present within the hole protects a lower interconnect in etching for forming the interconnect groove, the thickness of a passivation film formed on the lower interconnect can be small. Accordingly, the interconnect capacitance between the lower interconnect and an upper interconnect can be reduced, the reliability of the lower interconnect can be improved because a damage layer is prevented from being formed in the lower interconnect, and the interconnect groove minimally has a round shoulder in its uppermost wall so as to avoid a short-circuit between adjacent upper interconnects.

Furthermore, a fence of the insulating film is not formed in a boundary between the hole and the interconnect groove, and the peeling film in which a fence has been formed is ultimately removed. Therefore, a broken piece of a fence is not generated and a metal film is definitely filled in the hole. As a result, the reliability of the upper interconnect can be improved.

The third method for fabricating a semiconductor device of this invention includes the steps of depositing a peeling film on an insulating film, which is formed on a semiconductor substrate and has a hole, and on a bottom and a wall of the hole in such a manner that the hole is not filled with the peeling film; forming an organic film over the peeling film in such a manner that the hole is filled with the organic film; forming a resist pattern from a resist film, which is formed on the organic film, by patterning the resist film in such a manner that an interconnect groove opening is formed around the hole; forming an interconnect groove continuous with the hole in the insulating film by etching the peeling film and the insulating film with the resist pattern used as a mask; and removing a remaining portion of the peeling film after removing the resist pattern and the organic film.

In the third method for fabricating a semiconductor device, since the organic film present within the hole protects a lower interconnect in etching for forming the interconnect groove, the thickness of a passivation film formed on the lower interconnect can be small. Accordingly, the interconnect capacitance between the lower interconnect and an upper interconnect can be reduced, the reliability of the lower interconnect can be improved because a damage layer is prevented from being formed in the lower interconnect, and the interconnect groove minimally has a round shoulder in its uppermost wall so as to avoid a short-circuit between adjacent upper interconnects.

Furthermore, since a fence of the insulating film is not formed in a boundary between the hole and the interconnect groove and the peeling film in which a fence has been formed is ultimately removed, a broken piece of a fence is not generated and a metal film is definitely filled in the hole. As a result, the reliability of the upper interconnect can be improved.

In any of the first through third methods for fabricating a semiconductor device, a thickness of the peeling film is preferably 30% or less of a diameter of the hole.

In this manner, when the peeling film is deposited on the bottom and the wall of the hole so as not to fill the hole, the depth of etching for forming the interconnect groove cannot be too large and variation in the necessary groove depth can be small. As a result, variation in the interconnect resistance can be reduced.

In any of the first through third methods for fabricating a semiconductor device, it is preferred that the insulating film includes substantially neither a hydroxide nor a hydrate and the peeling film includes a hydroxide or a hydrate, and that the step of removing a remaining portion of the peeling film is performed by using vapor hydrofluoric acid.

Thus, a difference in the etching rate between the peeling film and the insulating film can be made large in the step of removing the remaining portion of the peeling film. Therefore, the side walls and the opening edges of the interconnect groove and the hole are touch to etch, so that the shape of the interconnect can be prevented from being spoiled due to side etching or the like. As a result, the reliability of the upper interconnect buried in the interconnect groove and the hole can be improved.

In any of the first through third methods for fabricating a semiconductor device, it is preferred that the peeling film is made from a BPSG film, and that the insulating film is made from a fluorine-containing silicon oxide film, a TEOS film, a silicon oxide nitrided film, a nondoped silicate glass film, a phosphorus-doped silicate glass film, a thermally oxidized film, a carbon-containing silicon oxide film or an organic-inorganic hybrid film.

Thus, a difference in the etching rate between the peeling film and the insulating film can be made large in the step of removing the remaining portion of the peeling film. Therefore, the side walls and the opening edges of the interconnect groove and the hole are touch to etch, so that the shape of the interconnect can be prevented from being spoiled due to the side etching or the like. As a result, the reliability of the upper interconnect buried in the interconnect groove and the hole can be improved.

In the case where the insulating film is made from a fluorine-containing silicon oxide film, a silicon oxide nitrided film, a carbon-containing silicon oxide film or an organic-inorganic hybrid film in any of the first through third methods for fabricating a semiconductor device, the present invention is particularly useful.

An insulating film made from a fluorine-containing silicon oxide film, a silicon oxide nitrided film, a carbon-containing silicon oxide film or an organic-inorganic hybrid film has a property to deactivate an acid generated from a chemically amplified resist. In the present invention, however, even when the resist pattern is made from a chemically amplified resist, an acid generated from the resist pattern is never deactivated because the peeling film is present between the insulating film and the resist pattern.

In any of the first through third methods for fabricating a semiconductor device, it is preferred that neither the insulating film nor the peeling film includes a metal element.

Thus, the variation in the etching depth in forming the interconnect groove can be reduced and a used etching chamber can be prevented from being contaminated with a metal.

In any of the first through third methods for fabricating a semiconductor device, the peeling film is preferably deposited by CVD.

Thus, even when the hole has a high aspect ratio, the peeling film can be easily and definitely deposited on the bottom and the wall of the hole without filling the hole, and the resultant peeling film minimally overhangs.

In the first method for fabricating a semiconductor device, the step of forming a resist film preferably includes a sub-step of allowing the resist film to thermally flow.

Thus, the resist film can be definitely filled in the hole.

Alternatively, in the second or third method for fabricating a semiconductor device, the step of forming an organic film preferably includes a sub-step of allowing the organic film to thermally flow.

Thus, the organic film can be definitely filled in the hole.

DETAILED DESCRIPTION OF THE INVENTION

Embodiment 1

A method for fabricating a semiconductor device according to Embodiment 1 of the invention will now be described with reference to FIGS. 1A, 1B, 2A, 2B, 3A, 3B, 4A, 4B, 5A and 5B.

Figure 1A:
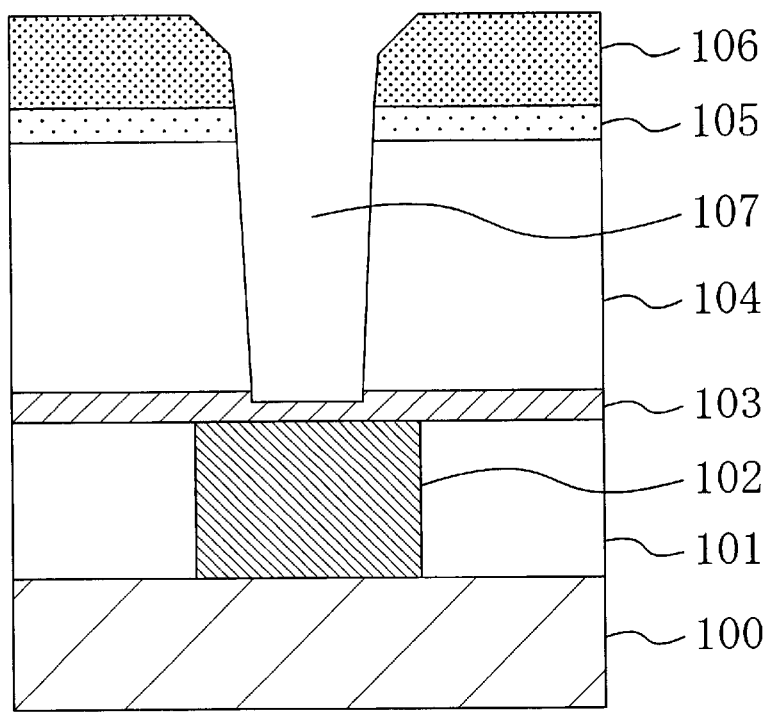
FIGS. 1A and 1B are cross-sectional views for showing procedures in a method for fabricating a semiconductor device according to Embodiment 1 of the invention.

First, as shown in FIG. 1A, a lower interconnect 102 of copper or aluminum is formed in a first insulating film 101 deposited on a semiconductor substrate 100. The lower interconnect 102 generally has a barrier metal layer, which is omitted in the drawings referred to in Embodiment 1.

Next, a passivation film 103 of, for example, a silicon nitride film with a comparatively small thickness of, for example, several tens nm is formed on the first insulating film 101. The passivation film 103 has a function to protect the lower interconnect 102 from corrosion with oxygen or moisture and a function as an etching stopper in an etching procedure for forming a hole 107.

Then, after depositing a second insulating film 104 on the passivation film 103, an antireflection film 105 is formed on the second insulating film 104.

Next, after applying a resist film on the antireflection film 105, the resist film is subjected to known lithography, so as to form a first resist pattern 106. Thereafter, the antireflection film 105 is etched by using the first resist pattern 106 as a mask, so as to pattern the antireflection film 105.

Subsequently, the second insulating film 104 is etched by using the first resist pattern 106 as a mask, so as to form the hole 107 in the second insulating film 104. In this etching procedure, the passivation film 103 works as the etching stopper. Thereafter, the first resist pattern 106 and etching residues are removed by ashing, and the substrate is cleaned.

Figure 1B:
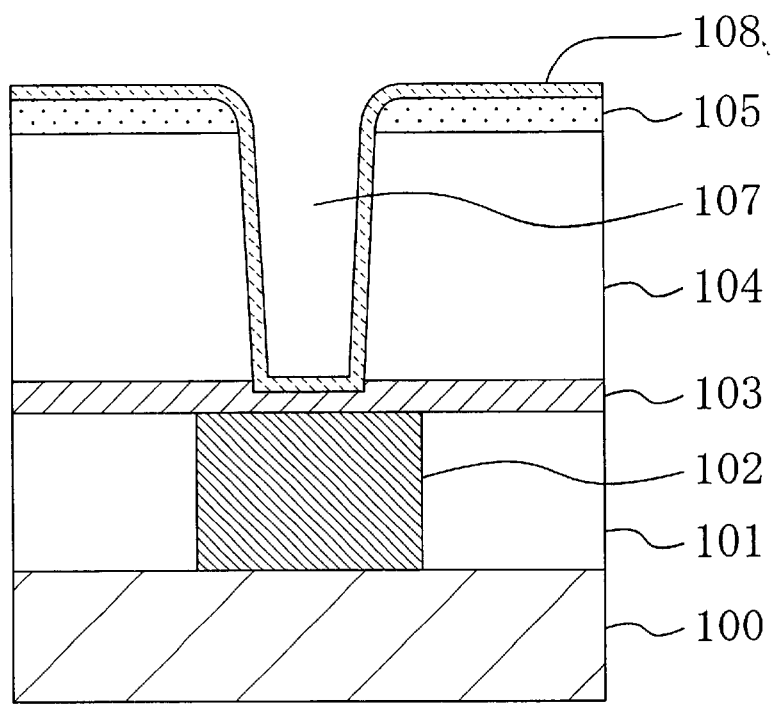

Next, as shown in FIG. 1B, a peeling film 108 of, for example, a BPSG film with a small thickness is deposited on the antireflection film 105 and on the bottom and the wall of the hole 107 by, for example, CVD, so as neither to fill the hole 107 nor to close the mouth of the hole 107.

Figure 2A:
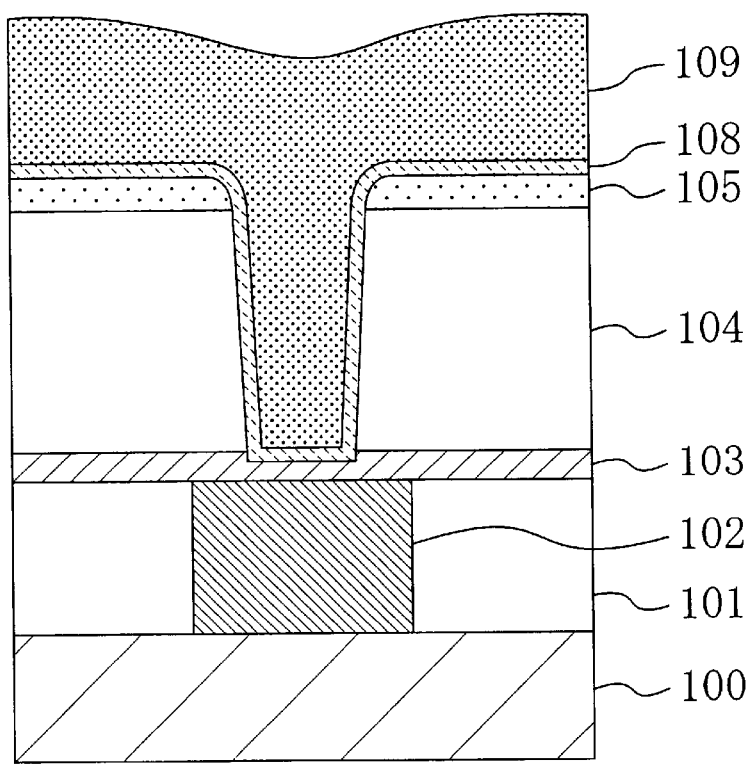
FIGS. 2A and 2B are cross-sectional views for showing other procedures in the method for fabricating a semiconductor device of Embodiment 1.

Then, as shown in FIG. 2A, a resist film 109 is formed over the peeling film 108 so as to fill the hole 107. The resist film 109 may be allowed to thermally flow into the hole 107. Thus, even when a resist material used for the resist film 109 has high viscosity, the resist film 109 can be definitely filled within the hole 107.

Figure 2B:
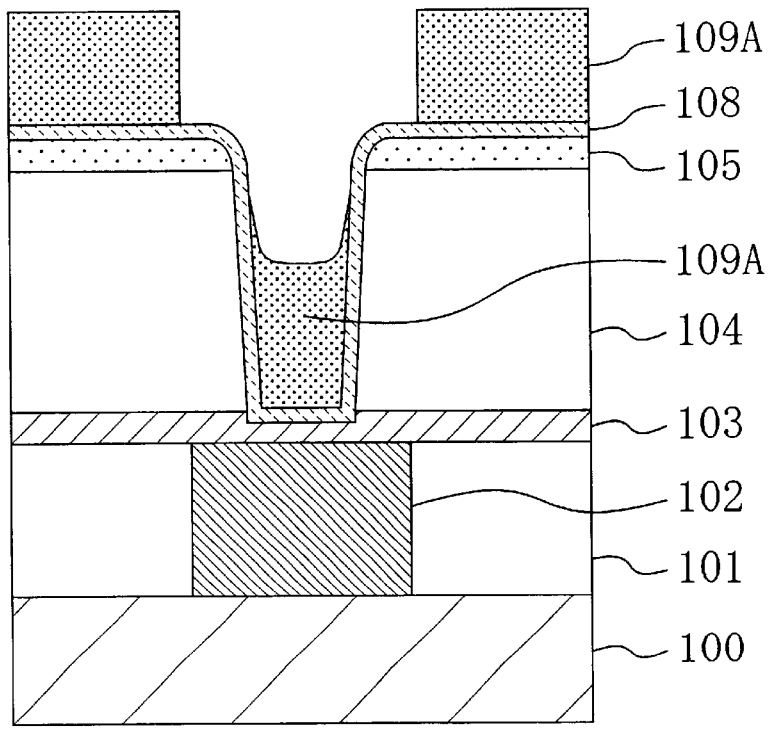

Next, as shown in FIG. 2B, the resist film 109 is patterned by the lithography, so that an interconnect groove opening can be formed around the hole 107 and that a portion of the resist film 109 can remain within the hole 107. Thus, the resist film 109 is formed into a second resist pattern 109A. In this case, since the focus is placed in a portion of the resist film 109 above the antireflection film 105 in pattern exposure of the resist film 109, the interconnect groove opening can be definitely formed around the hole 107. In addition, since exposing light is not focused in a portion from the center toward the bottom of the hole 107, the portion of the resist film 109 can remain in the portion from the center toward the bottom of the hole.

Figure 3A:
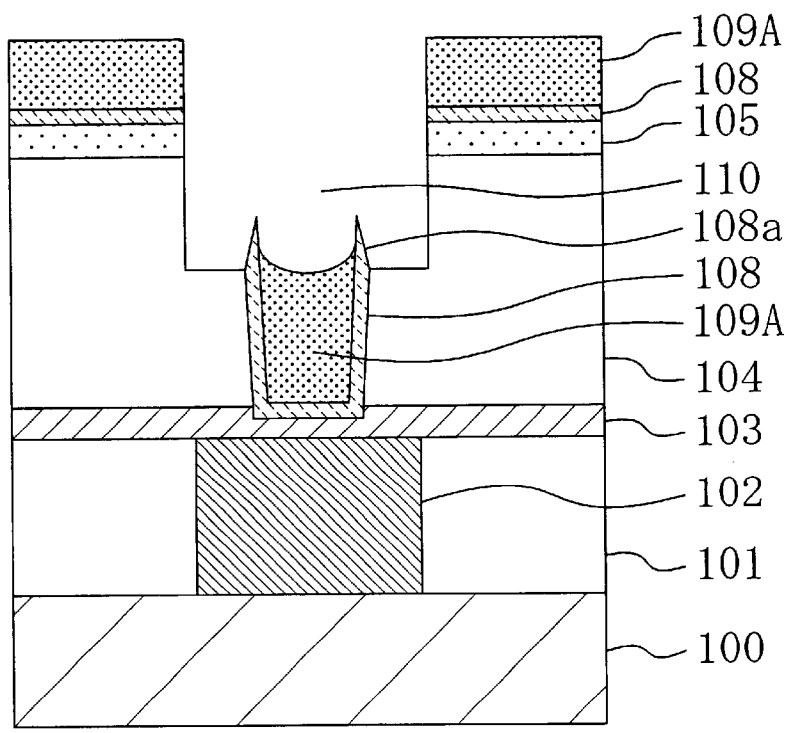
FIGS. 3A and 3B are cross-sectional views for showing other procedures in the method for fabricating a semiconductor device of Embodiment 1.

Next, as shown in FIG. 3A, the peeling film 108 and the second insulating film 104 are etched by using the second resist pattern 109A as a mask, so as to form an interconnect groove 110 continuous with the hole 107 in the second insulating film 104. In this manner, the second resist pattern 109A, an etching polymer and the like are adhered onto a portion of the peeling film 108 in a boundary between the hole 107 and the interconnect groove 110 so as to inhibit the proceeding of the etching. As a result, a fence 108a is formed in the portion of the peeling film 108 in the boundary between the hole 107 and the interconnect groove 110.

Figure 3B:
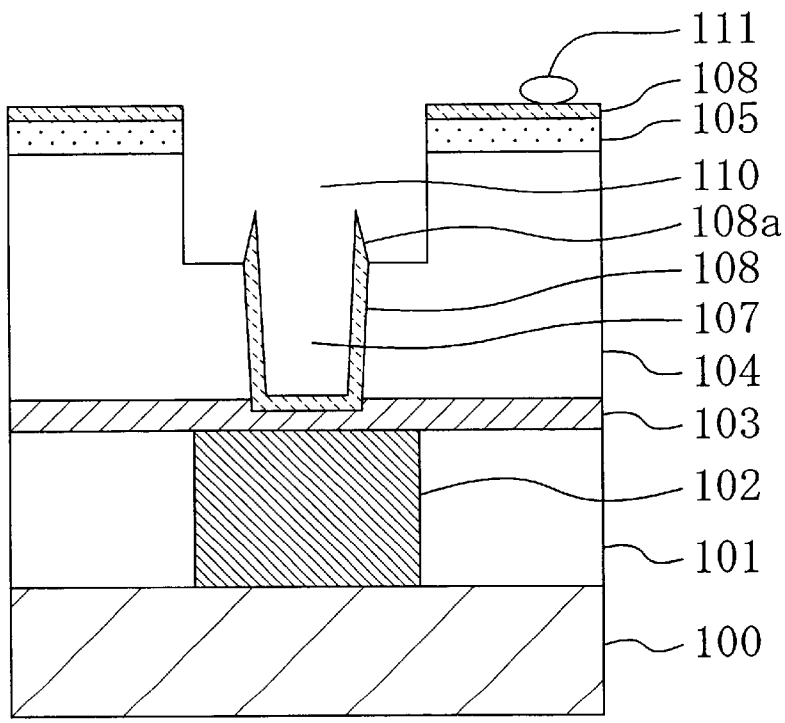

Then, as shown in FIG. 3B, portions of the second resist pattern 109A and the etching polymer present on the antireflection film 105 and within the hole 107 are removed by the ashing, and residues remaining after the ashing are removed by wet cleaning. After the wet cleaning, contaminations 111, such as a carbide resulting from the ashing and a particle adhered onto the peeling film 108 in forming the interconnect groove 110, remain on the peeling film 108.

Figure 4A:
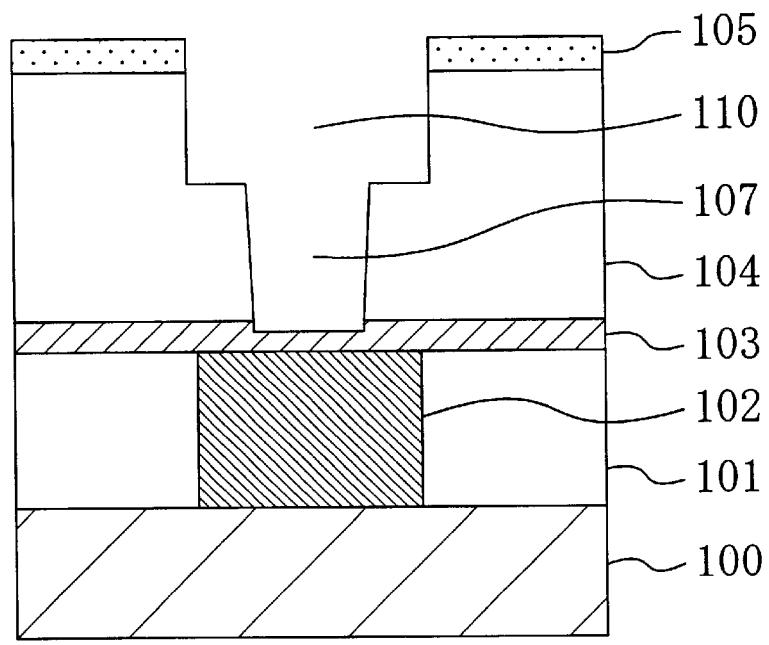
FIGS. 4A and 4B are cross-sectional views for showing other procedures in the method for fabricating a semiconductor device of Embodiment 1.

Next, as shown in FIG. 4A, the remaining peeling film 108 is removed by using, for example, vapor hydrofluoric acid. Thus, the peeling film 108 of a BPSG film can be satisfactorily etched while the second insulating film 104 is not etched with the vapor hydrofluoric acid, and therefore, only the peeling film 108 including the fence 108a can be definitely removed. Also, the contaminations 111 remaining on the peeling film 108 can be simultaneously removed.

Figure 4B:
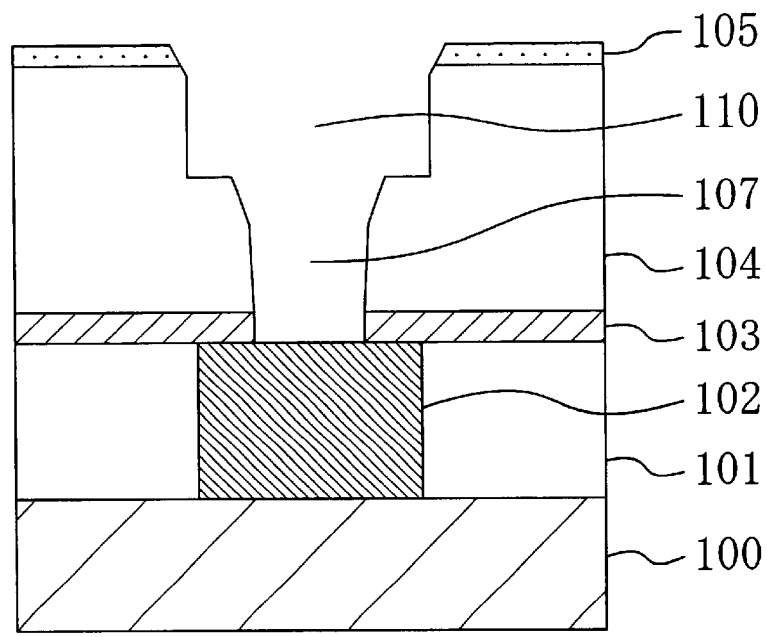

Then, as shown in FIG. 4B, the passivation film 108 is etched by using the second insulating film 104 as a mask, so as to expose the lower interconnect 102 in the hole 107.

Figure 5A:
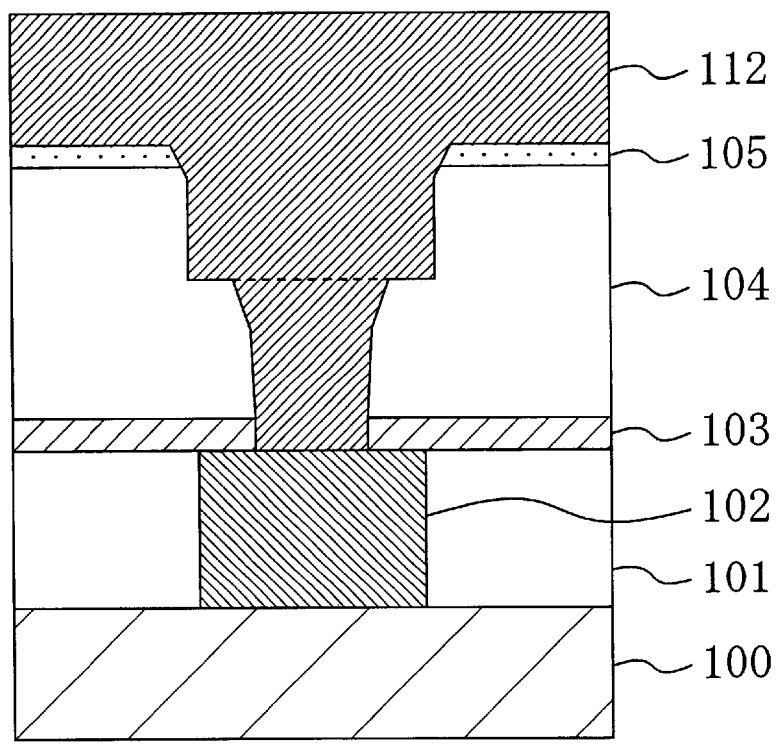
FIGS. 5A and 5B are cross-sectional views for showing other procedures in the method for fabricating a semiconductor device of Embodiment 1.
Figure 5B:
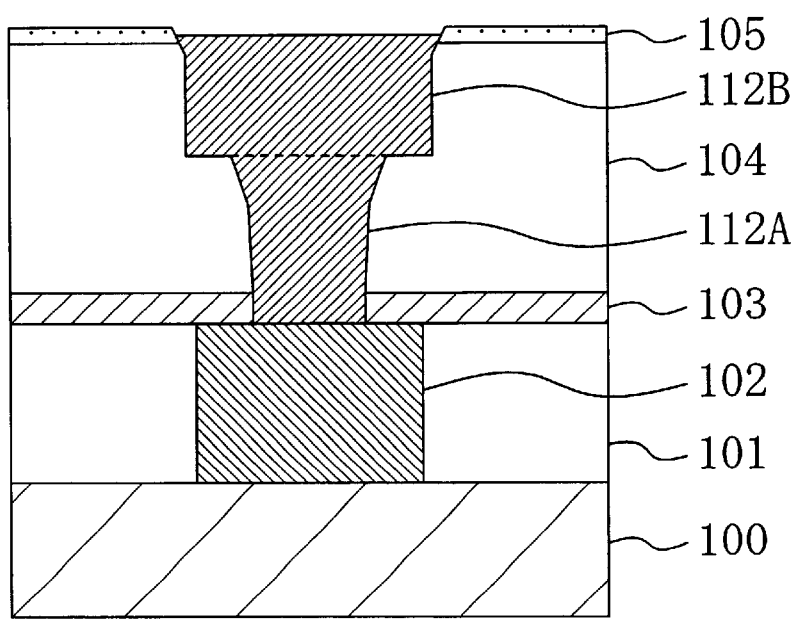

Subsequently, after performing a surface treatment of the lower interconnect 102, a metal film 112 is deposited over the antireflection film 105 and wholly within the hole 107 and the interconnect groove 110 with a barrier metal layer (not shown) sandwiched therebetween as shown in FIG. 5A. Thereafter, a portion of the metal film 112 present above the antireflection film 105 is removed by CMP. Thus, a plug 112A and an upper interconnect 112B made from the metal film 112 are formed.

In Embodiment 1, since the resist pattern 109A formed within the hole 107 protects the lower interconnect 102 in the etching procedure for forming the interconnect groove 110, the passivation film 103 should protect the lower interconnect 102 merely in the etching procedure for forming the hole 107. Therefore, the thickness of the passivation film 103 can be small.

Accordingly, the interconnect capacitance between the lower interconnect 102 and the upper interconnect 112B can be reduced. Also, the amount of passivation film 103 etched in the etching procedure for exposing the lower interconnect 102 is smaller. Therefore, no damage layer is formed in the lower interconnect 102, and hence, the reliability of the lower interconnect 102 can be improved. In addition, since the interconnect groove 110 minimally has a round shoulder in its uppermost wall, a short-circuit between adjacent upper interconnects 112B can be avoided.

Furthermore, in Embodiment 1, a fence of the second insulating film 104 can be prevented from being formed in the boundary between the hole 107 and the interconnect groove 110.

Therefore, a broken piece of the fence and the like are not generated, and hence, no scratch is caused on the top face of the antireflection film 105 in removing the portion of the metal film 112 present above the second insulating film 104 by the CMP. Moreover, since the metal film 112 can be definitely filled within the hole 107, no void is formed in the upper interconnect 112B, and hence, the reliability of the upper interconnect 112B can be improved.

The passivation film 103 may be made from, instead of a silicon nitride film, a carbon-containing silicon (SiC) film having a smaller dielectric constant than a silicon nitride film.

Furthermore, the second insulating film 104 can be made from, for example, a single-layer or multilayer film of a low dielectric film such as a SiOF film (a fluorine-containing silicon oxide film) or a SiOC film (a carbon-containing silicon oxide film), a thermally oxidized film, a TEOS film, a SiON film (a silicon oxide nitrided film), an NSG film (nondoped silicated glass film), a PSG film (a phosphorus-doped silicated glass film) or an organic-inorganic hybrid film. Among these films, a low dielectric film is preferred because the capacitance between the lower interconnect 102 and the upper interconnect 112B can be reduced by using a low dielectric film.

Moreover, the antireflection film 105 may be made from an ARL (antireflection layer) film deposited on the second insulating film 104 by the CVD or the like or an ARC (antireflection coat) film formed on the second insulating film 104 by coating. When an ARC film is used as the antireflection film 105, the antireflection film 105 and the resist film 109 can be formed by using one coating apparatus, and therefore, the number of procedures can be reduced and the thickness can be reduced as compared with the case where an ARL film is used. On the other hand, when an ARL film is used as the antireflection film 105, the antireflection film 105 can be used as a CMP stopper in performing the CMP on the metal film 112.

Furthermore, the thickness of the peeling film 108 is preferably set to 30% or less of the diameter of the hole 107. Thus, the peeling film 108 can be deposited without closing the mouth of the hole 107. Also, when the peeling film 108 has a thickness as small as possible or the peeling film 108 includes no metal element, variation otherwise caused in the subsequent procedures can be suppressed. Also, the peeling film 108 can be deposited by, for example, the CVD. The CVD is preferably employed for depositing the peeling film 108 because the peeling film 108 can be uniformly deposited on the bottom and the wall of the hole 107 in a small thickness.

In the procedure for etching the peeling film 108, etching conditions for attaining a small etching rate of the second insulating film 104 and a large etching rate of the peeling film 108 are preferably selected. For example, in the case where the peeling film 108 is made from a film including a large amount of a hydroxide or a hydrate such as a BPSG film, if the second insulating film 104 is made from a film including substantially neither a hydroxide nor a hydrate, such as a SiOF film, a SiOC film, a thermally oxidized film, a TEOS film, a SiON film, an NSG film, a PSG film or an organic-inorganic hybrid film, the etch selectivity in removing the peeling film 108 by using the vapor hydrofluoric acid can be improved.

Also, in conventional technique, in the case where a chemically amplified resist material is used for the second resist pattern 109A, the second insulating film 104 may deactivate the chemically amplified resist material if the second insulating film 104 is made from a SiOF film, a SiOC film, a SiON film or an organic-inorganic hybrid film. In contrast, in Embodiment 1, the second insulating film 104 never deactivates the chemically amplified resist material because the peeling film 108 is present between the second insulating film 104 and the second resist pattern 109A.

Embodiment 2

A method for fabricating a semiconductor device according to Embodiment 2 of the invention will now be described with reference to FIGS. 6A, 6B, 7A, 7B, 8A and 8B.

Figure 6A:
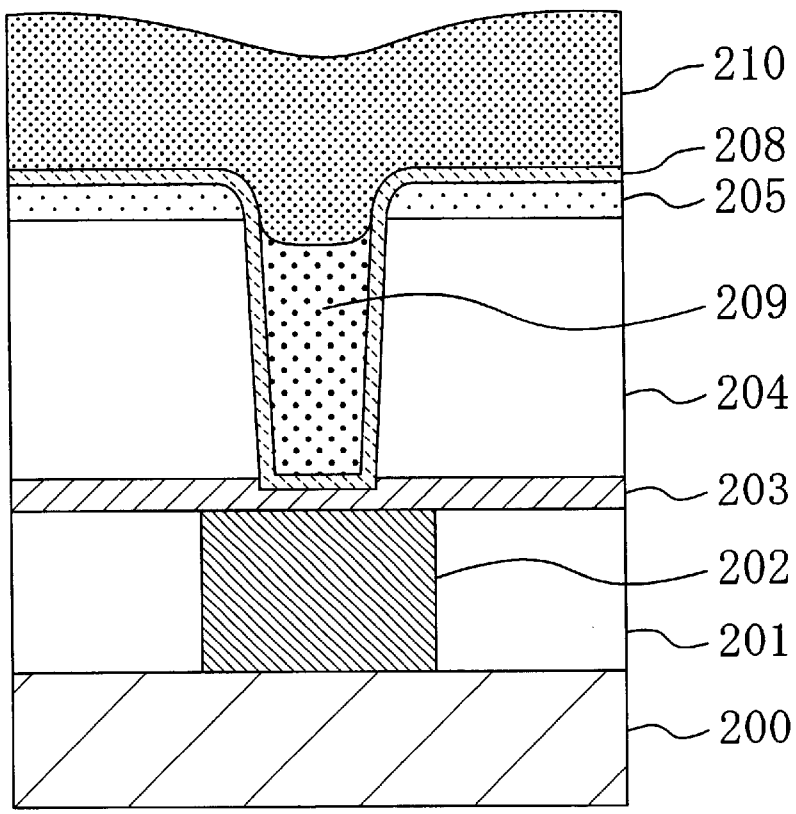
FIGS. 6A and 6B are cross-sectional views for showing procedures in a method for fabricating a semiconductor device according to Embodiment 2 of the invention.

In the same manner as in Embodiment 1, as shown in FIG. 6A, after forming a lower interconnect 202 in a first insulating film 201 deposited on a semiconductor substrate 200, a passivation film 203 of, for example, a silicon nitride film with a comparatively small thickness of, for example, several tens nm is formed on the first insulating film 201. Then, after depositing a second insulating film 204 on the passivation film 203, an antireflection film 205 is formed on the second insulating film 204. Thereafter, after forming a first resist pattern (not shown) on the antireflection film 205, the antireflection film 205 is etched by using the first resist pattern as a mask, so as to pattern the antireflection film 205. Next, the second insulating film 204 is etched by using the first resist pattern as a mask, so as to form a hole 207 (see FIG. 7B) in the second insulating film 204. Subsequently, a peeling film 208 of, for example, a BPSG film with a small thickness is deposited on the antireflection film 205 and on the bottom and the wall of the hole 207 by, for example, the CVD, so as neither to fill the hole 207 nor to close the mouth of the hole 207.

Next, as a characteristic of Embodiment 2, an organic material, such as an antireflection film material or a resist material, diluted with a solvent is allowed to flow into the hole 207, so as to form an organic film 209 on the peeling film 208 within the hole 207. In this case, since the organic material is diluted with a solvent, it can be easily allowed to flow into the hole 207 with a space formed in an upper portion of the hole 207. The organic material may be allowed to thermally flow into the hole 207. Thus, even when the organic material has high viscosity, the organic film 209 can be definitely formed by allowing the organic material to flow into the hole 207 with the space formed in the upper portion of the hole 207.

Next, a resist film 210 is formed over the peeling film 208 and the organic film 209.

Figure 6B:
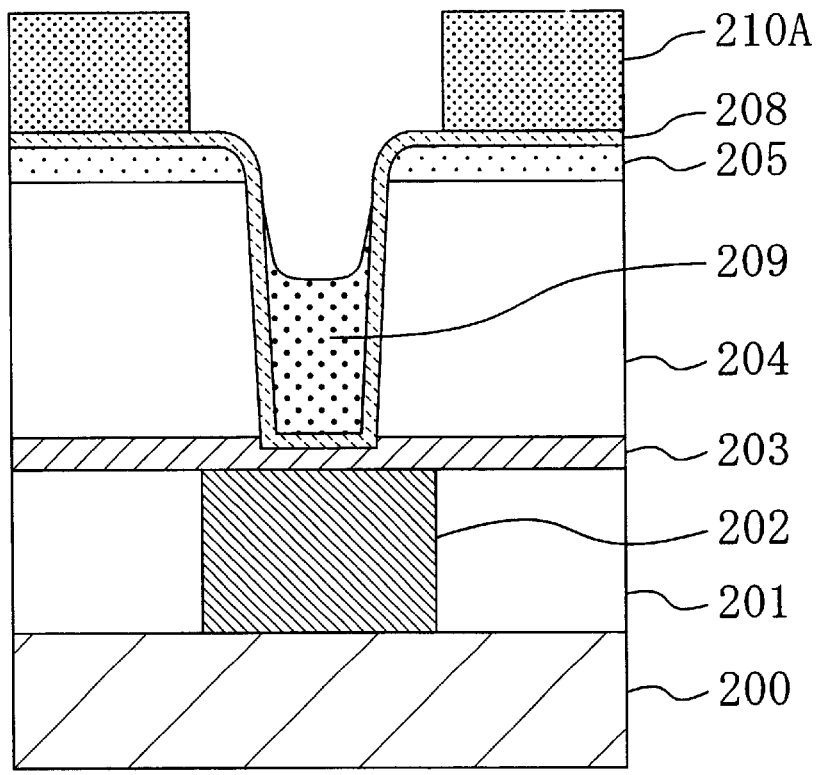

Then, as shown in FIG. 6B, the resist film 210 is patterned so as to form an interconnect groove opening around the hole 207, and thus, the resist film 210 is formed into a second resist pattern 210A. At this point, since an upper portion of the organic film 209 is also etched, the height of the organic film 209 is lowered.

Figure 7A:
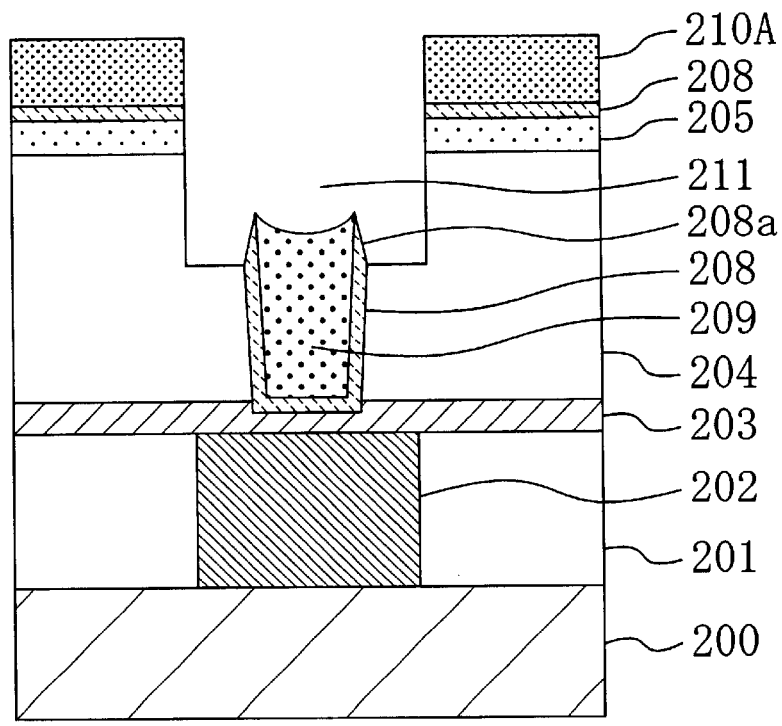
FIGS. 7A and 7B are cross-sectional views for showing other procedures in the method for fabricating a semiconductor device of Embodiment 2.

Subsequently, as shown in FIG. 7A, the peeling film 208 and the second insulating film 204 are etched by using the second resist pattern 210A as a mask, so as to form an interconnect groove 211 continuous with the hole 207 in the second insulating film 204. Thus, the second resist pattern 210A, an etching polymer and the like are adhered onto a portion of the peeling film 208 in a boundary between the hole 207 and the interconnect groove 211, so as to inhibit the proceeding of the etching. Therefore, a fence 208a is formed in the portion of the peeling film 208 in the boundary between the hole 207 and the interconnect groove 211.

Figure 7B:
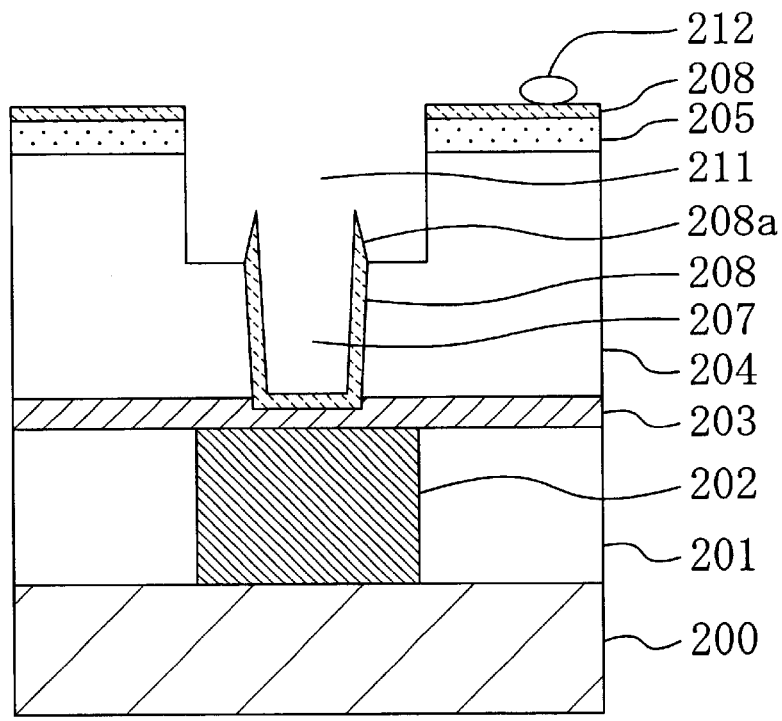

Next, as shown in FIG. 7B, portions of the second resist pattern 210A and the etching polymer present on the peeling film 208 and the organic film 209 present within the hole 207 are removed by the ashing, and residues remaining after the ashing are removed by the wet cleaning. After the wet cleaning, contaminations 212, such as a carbide resulting from the ashing and a particle adhered onto the peeling film 208 in forming the interconnect groove 211, remain on the peeling film 208.

Figure 8A:
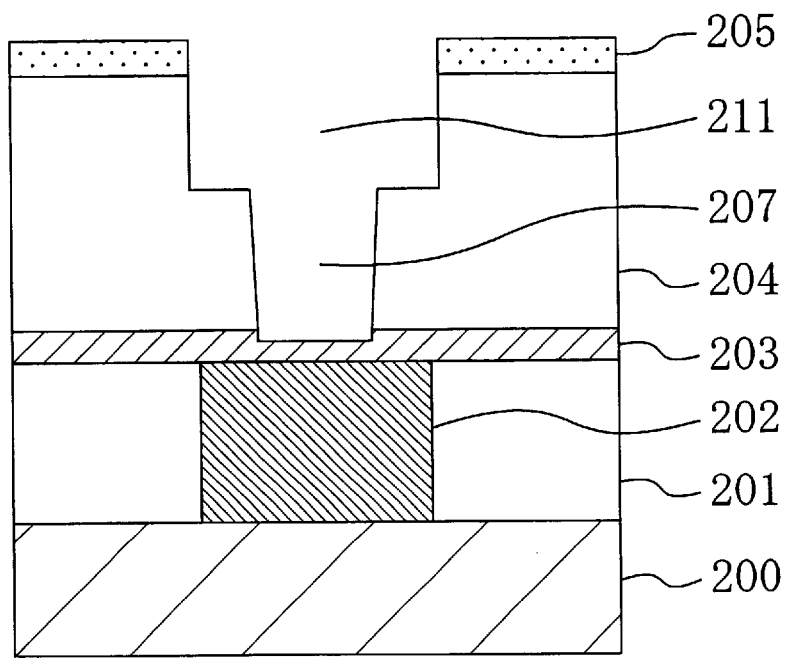
FIGS. 8A and 8B are cross-sectional views for showing other procedures in the method for fabricating a semiconductor device of Embodiment 2.

Then, as shown in FIG. 8A, the remaining peeling film 208 is removed by using, for example, vapor hydrofluoric acid. Thus, the peeling film 208 made from a BPSG film is satisfactorily removed while the second insulating film 204 is not etched by using the vapor hydrofluoric acid, and therefore, only the peeling film 208 including the fence 208a can be definitely removed. Also, the contaminations 212 remaining on the peeling film 208 can be simultaneously removed.

Figure 8B:
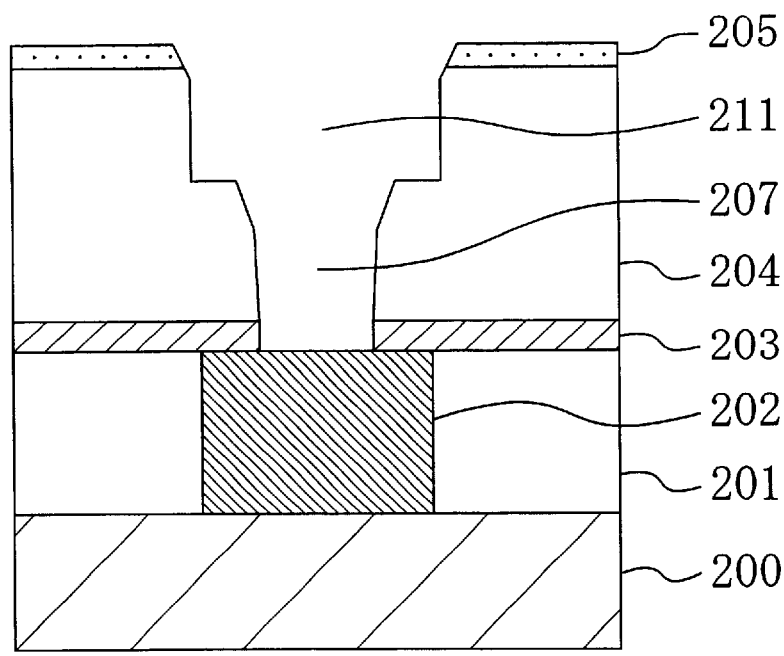

Subsequently, as shown in FIG. 8B, the passivation film 203 is etched by using the second insulating film 204 as a mask, so as to expose the lower interconnect 202 in the hole 207.

Ultimately, in the same manner as in Embodiment 1, after performing a surface treatment of the lower interconnect 202, a metal film is deposited over the antireflection film 205 and the inside of the hole 207 and the interconnect groove 211 with a barrier metal film (not shown) sandwiched therebetween. Then, a portion of the metal film present above the antireflection film 205 is removed. Thus, a plug and an upper interconnect made from the metal film can be obtained.

In Embodiment 2, since the organic film 209 protects the lower interconnect 202 in the etching procedure for forming the interconnect groove 211, the passivation film 203 protects the lower interconnect 202 merely in the etching procedure for forming the hole 207. Therefore, the thickness of the passivation film 203 can be small.

Accordingly, the capacitance between the lower interconnect 202 and the upper interconnect can be reduced. Also, the amount of passivation film 203 etched in the etching procedure for exposing the lower interconnect 202 is small. Therefore, no damage layer is formed in the lower interconnect 202, and hence, the reliability of the lower interconnect 202 can be improved. In addition, the interconnect groove 211 minimally has a round shoulder in its uppermost wall, and hence, a short-circuit between adjacent upper interconnects can be avoided.

In particular, the organic film 209 is preferably made from an antireflection film material in Embodiment 2 because the organic film 209 made from an antireflection film material can shield irregularly reflected light from the hole 207 in pattern exposure for forming the second resist pattern 210A by patterning the resist film 210.

In the case where the organic film is formed over the antireflection film 205 including the inside of the hole and the organic film is etched back for allowing the organic film to remain inside the hole alone in order to prevent the formation of a fence, the ashing and the cleaning cannot be performed after the etch back. Therefore, residues or contaminations present within the hole 207 or on the peeling film 208 cannot be removed.

In Embodiment 2, however, the organic material is allowed to flow into the hole 207 regardless of the formation of a fence so that the organic film 209 can be formed inside the hole 207 alone without forming it on the antireflection film 205. Therefore, the problem of residues or contaminations remaining inside the hole 207 or on the peeling film 208 can be overcome.

Furthermore, Japanese Laid-Open Patent Publication No. 11-154703 discloses a method for filling a metal oxide, such as $Ti_xO_y$ or $Ti_xNb_yO$, in a hole. When this method is employed, the following problems occur: In forming an interconnect groove by the etching, the metal oxide floats within an etching chamber, so as to cause contamination in the chamber and generate a large amount of particles. Also, it is very difficult to control simultaneous etching of a metal oxide film and a second insulating film. In addition, although the metal oxide film should have a large thickness for preventing a second resist pattern from entering the hole, this large thickness can disadvantageously vary the depth of the interconnect groove.

In Embodiment 2, however, since the organic film 209 is buried in the hole 207, these problems can be avoided.

Also, in Embodiment 2, no fence of the second insulating film 204 is formed in the boundary between the hole 207 and the interconnect groove 211.

Therefore, a broken piece of a fence is not generated, and hence, no scratch is caused on the antireflection film 205 in removing the portion of the metal film, used for forming the plug and the upper interconnect, present above the second insulating film 204 by the CMP. Moreover, since the hole 207 can be definitely filled with the metal film, no void is formed within the upper interconnect, so that the reliability of the upper interconnect can be improved.

Also in Embodiment 2, the passivation film 203 may be made from a SiC film, and the second insulating film 204 may be made from a single-layer or a multilayer film of a SiOF film, a SiOC film, a thermally oxidized film, a TEOS film, a SiON film, an NSG film, a PSG film or an organic-inorganic hybrid film, and the antireflection film 205 may be made from an ARL film or an ARC film.

Moreover, also in Embodiment 2, the thickness of the peeling film 208 is preferably set to 30% or less of the diameter of the hole 207. Furthermore, when the thickness of the peeling film 208 is as small as possible or the peeling film 208 includes no metal element, the variation in the depth of the groove can be suppressed in the subsequent procedures.

Also in Embodiment 2, in the procedure for etching the peeling film 208, etching conditions for attaining a small etching rate of the second insulating film 204 and a large etching rate of the peeling film 208 are preferably selected. For example, in the case where the peeling film 208 is made from a film including a large amount of a hydroxide or a hydrate such as a BPSG film, if the second insulating film 204 is made from a film including substantially neither a hydroxide nor a hydrate, such as a SiOF film, a SiOC film, a thermally oxidized film, a TEOS film, a SiON film, an NSG film, a PSG film or an organic-inorganic hybrid film, the etch selectivity in removing the peeling film 208 by using the vapor hydrofluoric acid can be improved.

Furthermore, even when the second resist pattern 210A is made from a chemically amplified resist, the second insulating film 204 does not deactivate the chemically amplified resist because the peeling film 208 is present between the second insulating film 204 and the second resist pattern 210A.

Embodiment 3

A method for fabricating a semiconductor device according to Embodiment 3 of the invention will now be described with reference to FIGS. 9A, 9B, 10A, 10B, 11A and 11B.

Figure 9A:
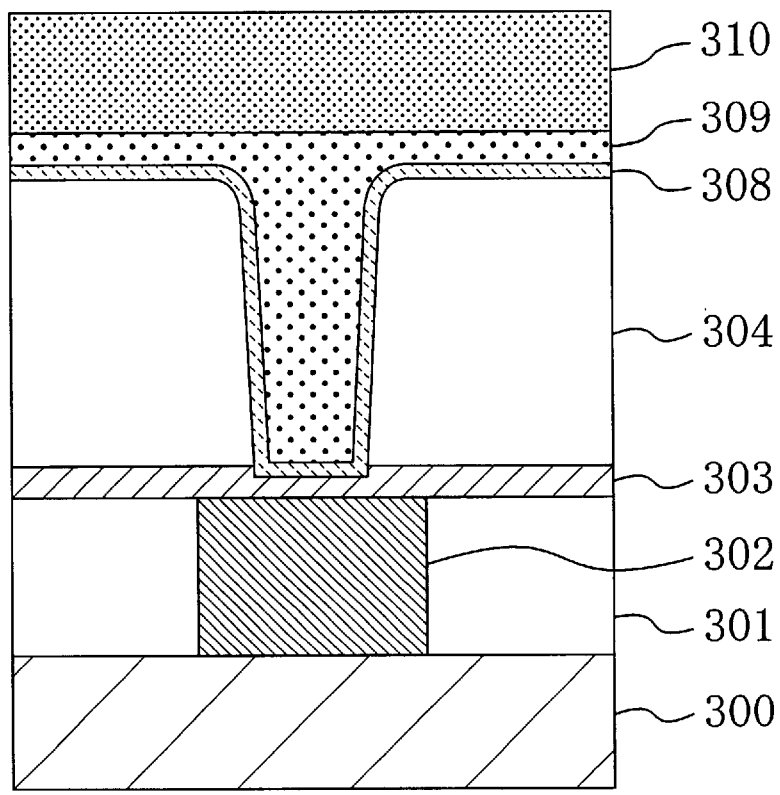
FIGS. 9A and 9B are cross-sectional views for showing procedures in a method for fabricating a semiconductor device according to Embodiment 3 of the invention.

In the same manner as in Embodiment 1, as shown in FIG. 9A, after forming a lower interconnect 302 in a first insulating film 301 deposited on a semiconductor substrate 300, a passivation film 303 of, for example, a silicon nitride film with a comparatively small thickness of, for example, several tens nm is formed on the first insulating film 301. Then, after depositing a second insulating film 304 on the passivation film 303, a first resist pattern (not shown) is formed on the second insulating film 304. Thereafter, the second insulating film 304 is etched by using the first resist pattern as a mask, so as to form a hole 307 (see FIG. 10B) in the second insulating film 304. Subsequently, a peeling film 308 of, for example, a BPSG film with a small thickness is deposited on the second insulating film 304 and on the bottom and the wall of the hole 307 by, for example, the CVD, so as neither to fill the hole 307 nor to close the mouth of the hole 307.

Next, as a characteristic of Embodiment 3, an organic material such as an antireflection film material diluted with a solvent is applied over the peeling film 308 so as to fill the hole 307. Thus, an organic film 309 is formed. In this case, the organic material can be easily allowed to flow into the hole 307 because it is diluted with a solvent. The organic material may be allowed to thermally flow into the hole 307.

Then, a resist film 310 is formed over the organic film 309.

Figure 9B:
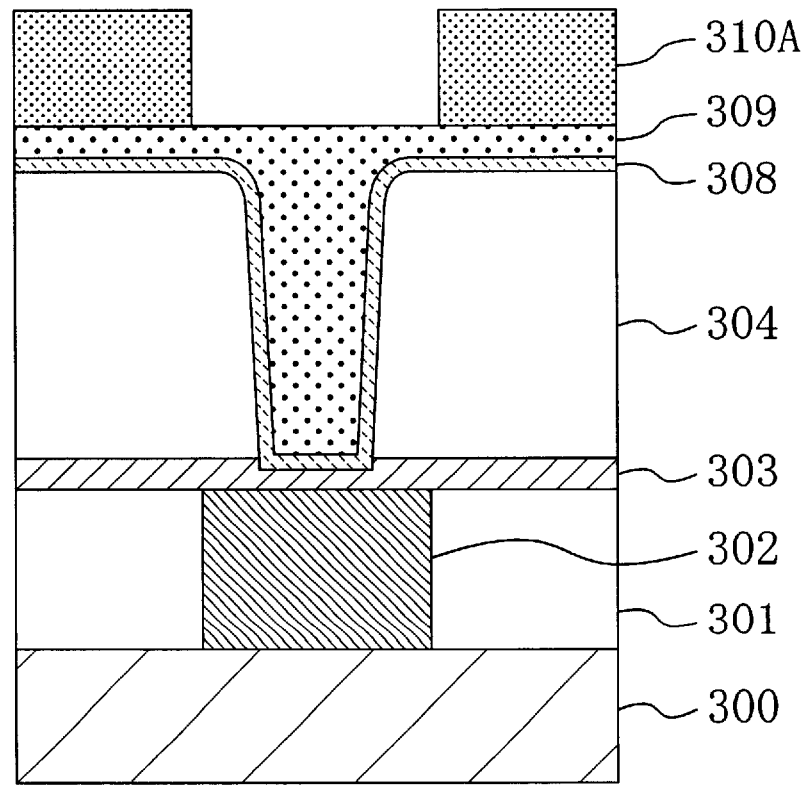

Subsequently, as shown in FIG. 9B, the resist film 310 is patterned so as to form an interconnect groove opening around the hole 307. Thus, the resist film 310 is formed into a second resist pattern 310A.

Figure 10A:
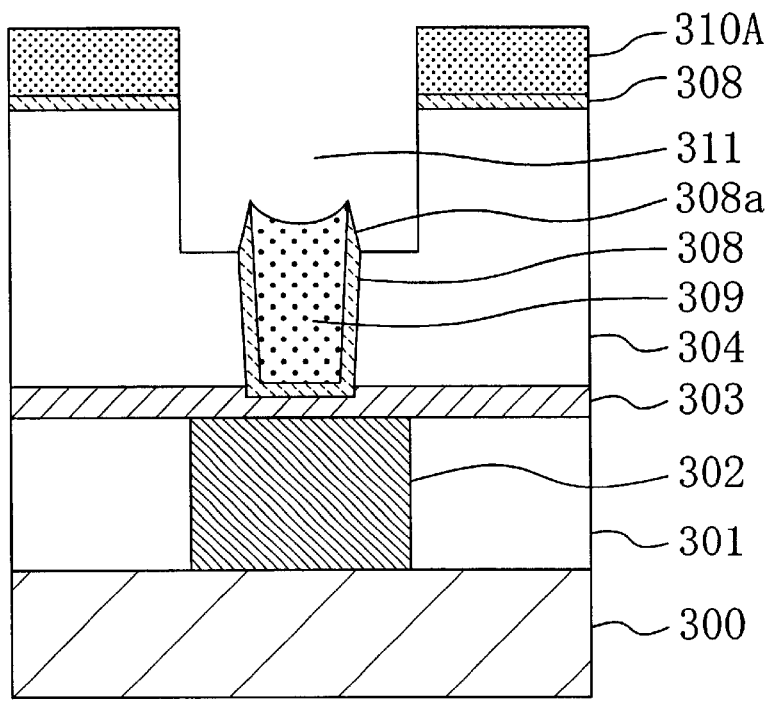
FIGS. 10A and 10B are cross-sectional views for showing other procedures in the method for fabricating a semiconductor device of Embodiment 3.

Next, as shown in FIG. 10A, the organic film 309, the peeling film 308 and the second insulating film 304 are etched by using the second resist pattern 310A as a mask, so as to form an interconnect groove 311 continuous with the hole 307 in the second insulating film 304. Thus, the second resist pattern 310A, an etching polymer and the like are adhered onto a portion of the peeling film 308 in a boundary between the hole 307 and the interconnect groove 311 so as to inhibit the proceeding of the etching. Therefore, a fence 308a is formed in the portion of the peeling film 308 in the boundary between the hole 307 and the interconnect groove 311.

Figure 10B:
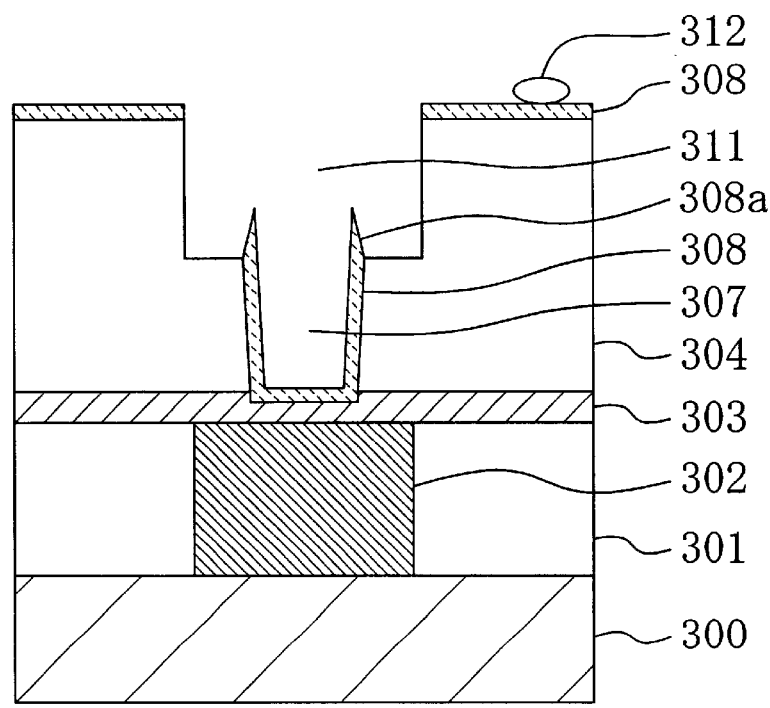

Then, as shown in FIG. 10B, portions of the second resist pattern 310A and the etching polymer present above the peeling film 308 and the organic film 309 present within the hole 307 are removed by the ashing, and residues remaining after the ashing are removed by the wet cleaning. After the wet cleaning, contaminations 312, such as a carbide resulting from the ashing and particles adhered onto the peeling film 308 in forming the interconnect groove 311, remain on the peeling film 308.

Figure 11A:
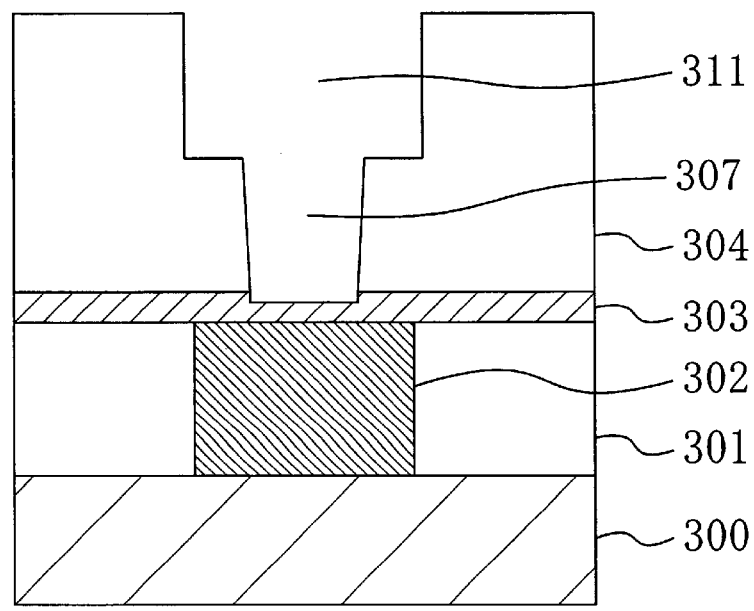
FIGS. 11A and 11B are cross-sectional views for showing other procedures in the method for fabricating a semiconductor device of Embodiment 3.

Next, as shown in FIG. 11A, the remaining peeling film 308 is removed by using, for example, vapor hydrofluoric acid. Thus, the peeling film 308 made from a BPSG film is satisfactorily etched while the second insulating film 304 is not etched by using the vapor hydrofluoric acid. Therefore, only the peeling film 308 including the fence 308a can be definitely removed. Also, the contaminations 312 remaining on the peeling film 308 can be simultaneously removed.

Figure 11B:
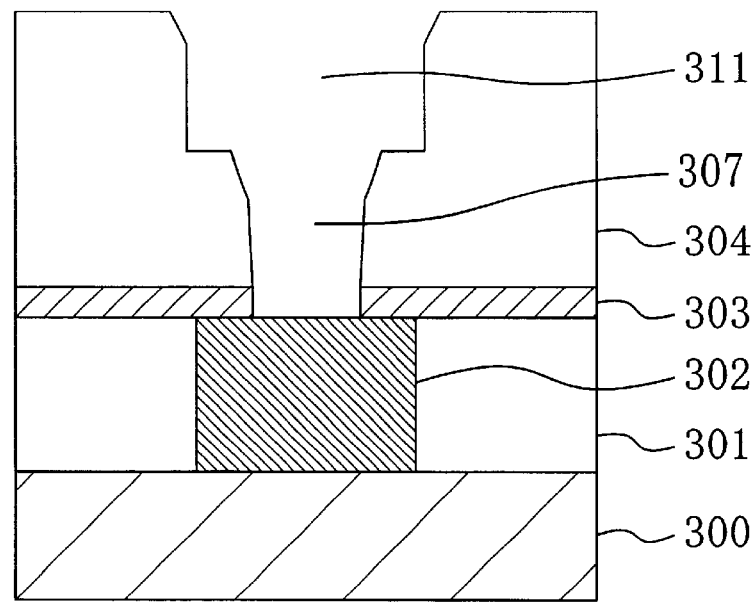
Figure 12A:
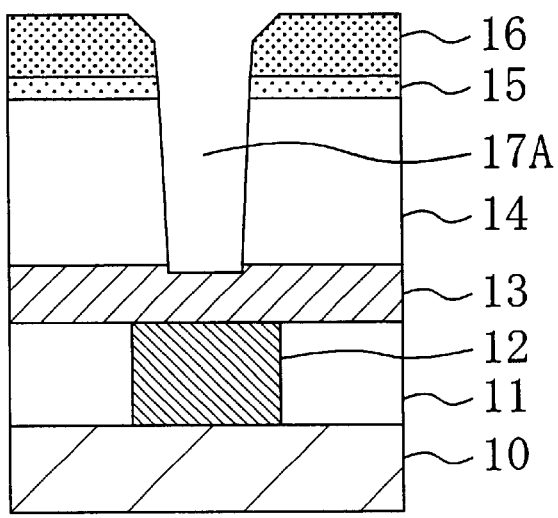
FIGS. 12A, 12B and 12C are cross-sectional views for showing procedures in a first conventional method for fabricating a semiconductor device.
Figure 12B:
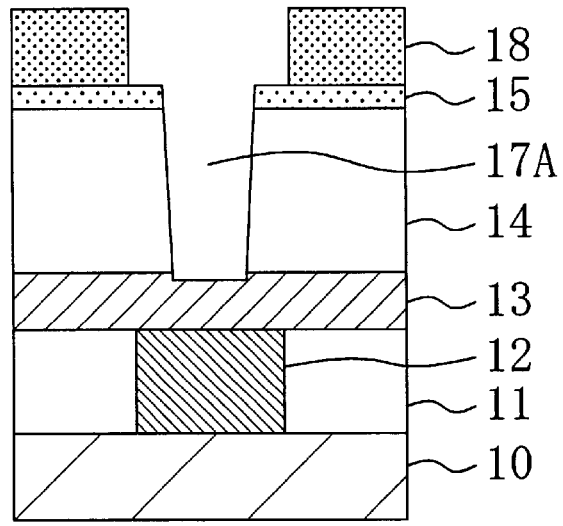
Figure 12C:
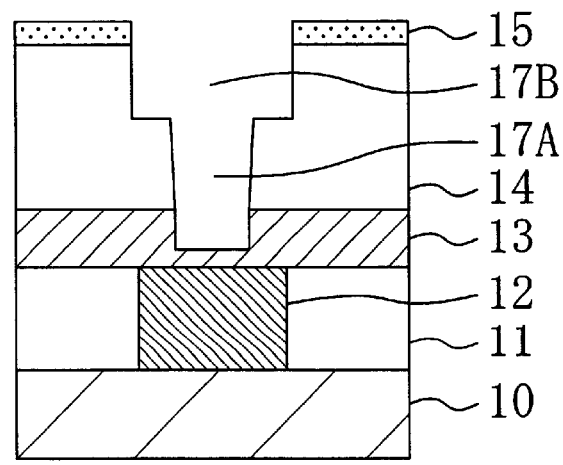
Figure 13A:
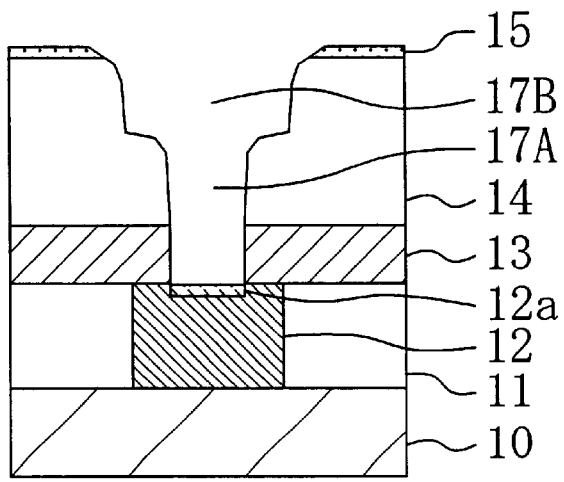
FIGS. 13A, 13B and 13C are cross-sectional views for showing procedures in the first conventional method for fabricating a semiconductor device.
Figure 13B:
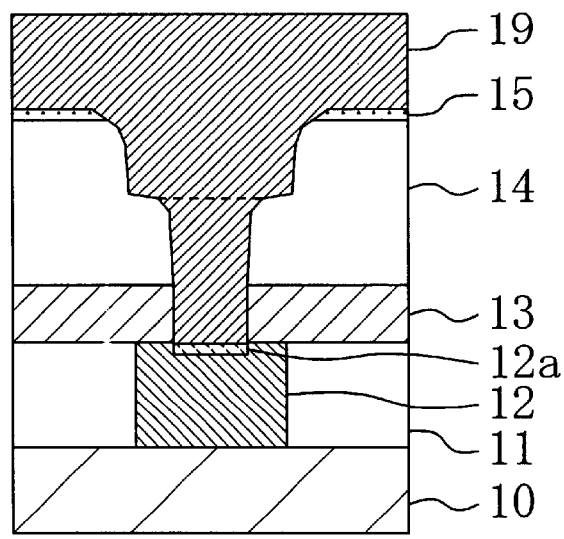
Figure 13C:
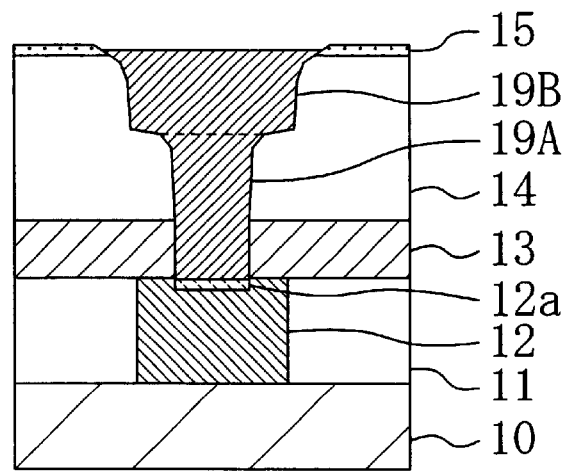
Figure 14A:
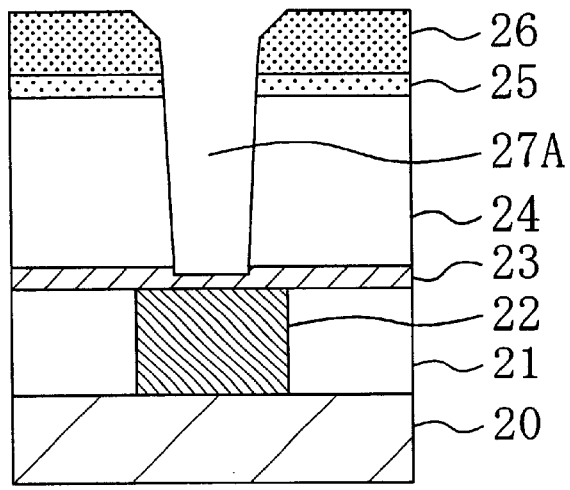
FIGS. 14A, 14B and 14C are cross-sectional views for showing procedures in a second conventional method for fabricating a semiconductor device.
Figure 14B:
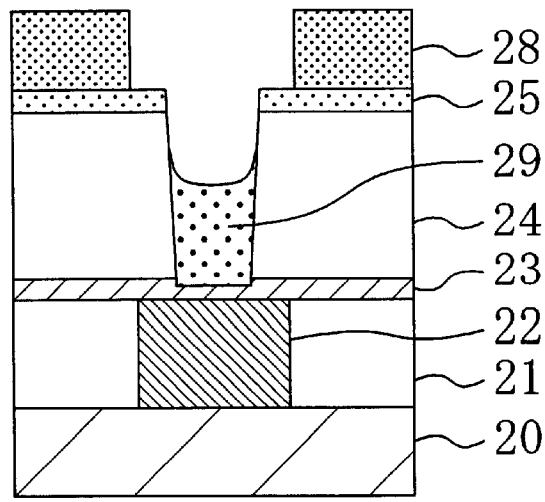
Figure 14C:
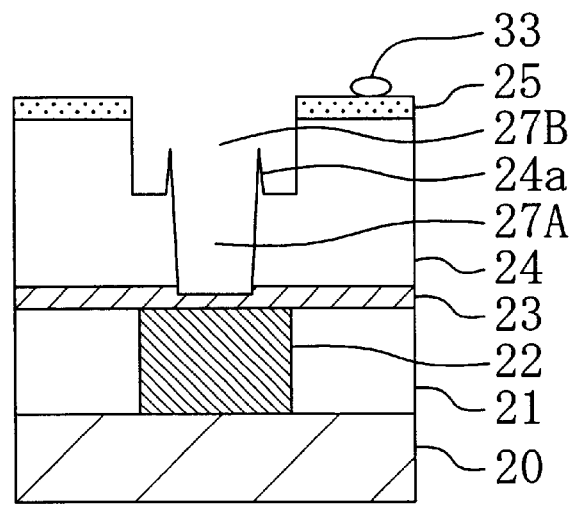
Figure 15A:
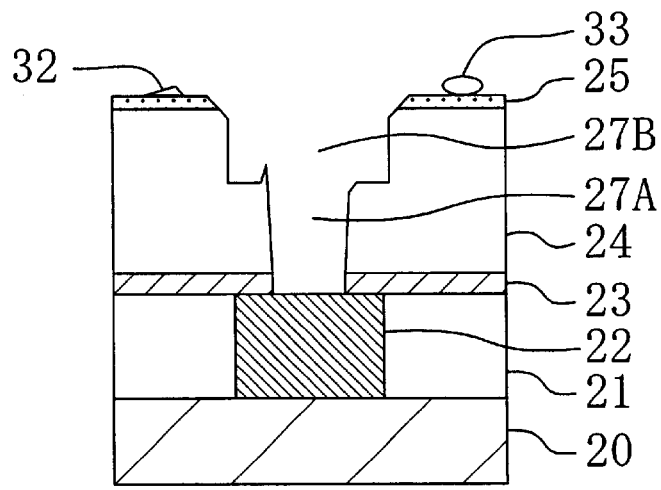
FIGS. 15A, 15B and 15C are cross-sectional views for showing procedures in the second conventional method for fabricating a semiconductor device.
Figure 15B:
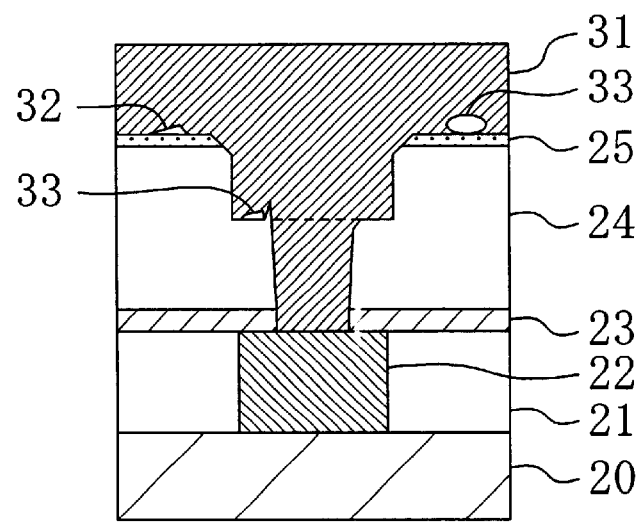
Figure 15C:
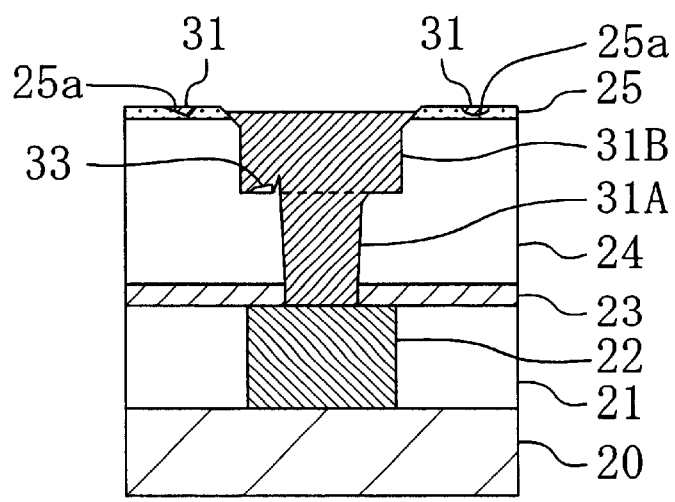

Then, as shown in FIG. 11B, the passivation film 303 is etched by using the second insulating film 304 as a mask, so as to expose the lower interconnect 302 in the hole 307.

Subsequently, in the same manner as in Embodiment 1, after performing a surface treatment of the lower interconnect 302, a metal film is deposited on the second insulating film 304 and within the hole 307 and the interconnect groove 311 with a barrier metal layer (not shown) sandwiched therebetween. Ultimately, a portion of the metal film present above the second insulating film 304 is removed by the CMP. Thus, a plug and an upper interconnect made from the metal film are obtained.

According to Embodiment 3, the organic film 309 protects the lower interconnect 302 in the etching procedure for forming the interconnect groove 311, and hence, the passivation film 303 protects the lower interconnect 302 merely in the etching procedure for forming the hole 307. Therefore, the thickness of the passivation film 303 can be small.

Accordingly, the capacitance between the lower interconnect 302 and the upper interconnect can be reduced. Also, the amount of passivation film 303 etched in the etching procedure for exposing the lower interconnect 302 is small. Therefore, no damage layer is formed in the lower interconnect 302, and hence, the reliability of the lower interconnect 302 can be improved. Moreover, the interconnect groove 311 minimally has a round shoulder in its uppermost wall, and hence, a short-circuit between adjacent upper interconnects can be prevented.

In particular, the organic film 309 is preferably made from an antireflection film material in Embodiment 3 because the organic film 309 made from an antireflection film material can shield irregularly reflected light from the hole 307 in pattern exposure for forming the second resist pattern 310A by patterning the resist film 310.

Furthermore, since there is no need to etch back the organic film 309, the problems of particles and residues generated as a result of etch back and a failure in cleaning performed after the etch back can be avoided.

Also, in Embodiment 3, no fence of the second insulating film 304 is formed in the boundary between the hole 307 and the interconnect groove 311.

Therefore, a broken piece of a fence is not generated, and hence, no scratch is caused on the antireflection film 305 in removing the portion of the metal film, used for forming the plug and the upper interconnect, present above the second insulating film 304 by the CMP. Moreover, since the hole 307 can be definitely filled with the metal film, no void is formed within the upper interconnect, so that the reliability of the upper interconnect can be improved.

Also in Embodiment 3, the passivation film 303 may be made from a SiC film, and the second insulating film 304 may be made from a single-layer or a multilayer film of a SiOF film, a SiOC film, a thermally oxidized film, a TEOS film, a SiON film, an NSG film, a PSG film or an organic-inorganic hybrid film.

Moreover, also in Embodiment 3, the thickness of the peeling film 308 is preferably set to 30% or less of the diameter of the hole 307. Furthermore, when the thickness of the peeling film 308 is as small as possible or the peeling film 308 includes no metal element, the variation in the depth of the groove can be suppressed in the subsequent procedures.

Also in Embodiment 3, in the procedure for etching the peeling film 308, etching conditions for attaining a small etching rate of the second insulating film 304 and a large etching rate of the peeling film 308 are preferably selected. For example, in the case where the peeling film 308 is made from a film including a large amount of a hydroxide or a hydrate such as a BPSG film, if the second insulating film 304 is made from a film including substantially neither a hydroxide nor a hydrate, such as a SiOF film, a SiOC film, an thermally oxidized film, a TEOS film, a SiON film, an NSG film, a PSG film or an organic-inorganic hybrid film, the etch selectivity in removing the peeling film 308 by using the vapor hydrofluoric acid can be improved.

Furthermore, even when the second resist pattern 310A is made from a chemically amplified resist, the second insulating film 304 does not deactivate the chemically amplified resist because the peeling film 308 is present between the second insulating film 304 and the second resist pattern 310A.

What is claimed is:

1. A method for fabricating a semiconductor device comprising the steps of:

depositing a peeling film on an insulating film, which is formed on a semiconductor substrate and has a hole, and on a bottom and a wall of said hole in such a manner that said hole is not filled with said peeling film;

forming a resist film over said peeling film in such a manner that said hole is filled with said resist film;

forming a resist pattern from said resist film by patterning said resist film in such a manner that an interconnect groove opening is formed around said hole and that a portion of said resist film remains within said hole;

forming an interconnect groove continuous with said hole in said insulating film by etching said peeling film and said insulating film with said resist pattern used as a mask; and removing a remaining portion of said peeling film after removing said resist pattern.

2. The method for fabricating a semiconductor device of claim 1, wherein a thickness of said peeling film is 30% or less of a diameter of said hole.

3. The method for fabricating a semiconductor device of claim 1, wherein said insulating film includes substantially neither a hydroxide nor a hydrate and said peeling film includes a hydroxide or a hydrate, and the step of removing a remaining portion of said peeling film is performed by using vapor hydrofluoric acid.

4. The method for fabricating a semiconductor device of claim 1, wherein said peeling film is made from a BPSG film, and said insulating film is made from a fluorine-containing silicon oxide film, a TEOS film, a silicon oxide nitrided film, a nondoped silicate glass film, a phosphorus-doped silicate glass film, a thermally oxidized film, a carbon-containing silicon oxide film or an organic-inorganic hybrid film.

5. The method for fabricating a semiconductor device of claim 1, wherein said insulating film is made from a fluorine-containing silicon oxide film, a silicon oxide nitrided film, a carbon-containing silicon oxide film or an organic-inorganic hybrid film.

6. The method for fabricating a semiconductor device of claim 1, wherein neither said insulating film nor said peeling film includes a metal element.

7. The method for fabricating a semiconductor device of claim 1, wherein said peeling film is deposited by CVD.

8. The method for fabricating a semiconductor device of claim 1, wherein the step of forming a resist film includes a sub-step of allowing said resist film to thermally flow.

9. A method for fabricating a semiconductor device comprising the steps of:

depositing a peeling film on an insulating film, which is formed on a semiconductor substrate and has a hole, and on a bottom and a wall of said hole in such a manner that said hole is not filled with said peeling film;

forming an organic film on a portion of said peeling film within said hole;

forming a resist pattern from a resist film, which is formed on said peeling film and said organic film, by patterning said resist film in such a manner that an interconnect groove opening is formed around said hole;

forming an interconnect groove continuous with said hole in said insulating film by etching said peeling film and said insulating film with said resist pattern used as a mask; and removing a remaining portion of said peeling film after removing said resist pattern and said organic film.

10. The method for fabricating a semiconductor device of claim 9, wherein a thickness of said peeling film is 30% or less of a diameter of said hole.

11. The method for fabricating a semiconductor device of claim 9, wherein said insulating film includes substantially neither a hydroxide nor a hydrate and said peeling film includes a hydroxide or a hydrate, and the step of removing a remaining portion of said peeling film is performed by using vapor hydrofluoric acid.

12. The method for fabricating a semiconductor device of claim 9, wherein said peeling film is made from a BPSG film, and said insulating film is made from a fluorine-containing silicon oxide film, a TEOS film, a silicon oxide nitrided film, a nondoped silicate glass film, a phosphorus-doped silicate glass film, a thermally oxidized film, a carbon-containing silicon oxide film or an organic-inorganic hybrid film.

13. The method for fabricating a semiconductor device of claim 9, wherein said insulating film is made from a fluorine-containing silicon oxide film, a silicon oxide nitrided film, a carbon-containing silicon oxide film or an organic-inorganic hybrid film.

14. The method for fabricating a semiconductor device of claim 9, wherein neither said insulating film nor said peeling film includes a metal element.

15. The method for fabricating a semiconductor device of claim 9, wherein said peeling film is deposited by CVD.

16. The method for fabricating a semiconductor device of claim 9, wherein the step of forming an organic film includes a sub-step of allowing said organic film to thermally flow.

17. A method for fabricating a semiconductor device comprising the steps of:

depositing a peeling film on an insulating film, which is formed on a semiconductor substrate and has a hole, and on a bottom and a wall of said hole in such a manner that said hole is not filled with said peeling film;

forming an organic film over said peeling film in such a manner that said hole is filled with said organic film;

forming a resist pattern from a resist film, which is formed on said organic film, by patterning said resist film in such a manner that an interconnect groove opening is formed around said hole;

forming an interconnect groove continuous with said hole in said insulating film by etching said peeling film and said insulating film with said resist pattern used as a mask; and removing a remaining portion of said peeling film after removing said resist pattern and said organic film.

18. The method for fabricating a semiconductor device of claim 17, wherein a thickness of said peeling film is 30% or less of a diameter of said hole.

19. The method for fabricating a semiconductor device of claim 17, wherein said insulating film includes substantially neither a hydroxide nor a hydrate and said peeling film includes a hydroxide or a hydrate, and the step of removing a remaining portion of said peeling film is performed by using vapor hydrofluoric acid.

20. The method for fabricating a semiconductor device of claim 17, wherein said peeling film is made from a BPSG film, and said insulating film is made from a fluorine-containing silicon oxide film, a TEOS film, a silicon oxide nitrided film, a nondoped silicate glass film, a phosphorus-doped silicate glass film, a thermally oxidized film, a carbon-containing silicon oxide film or an organic-inorganic hybrid film.

21. The method for fabricating a semiconductor device of claim 17, wherein said insulating film is made from a fluorine-containing silicon oxide film, a silicon oxide nitrided film, a carbon-containing silicon oxide film or an organic-inorganic hybrid film.

22. The method for fabricating a semiconductor device of claim 17, wherein neither said insulating film nor said peeling film includes a metal element.

23. The method for fabricating a semiconductor device of claim 17, wherein said peeling film is deposited by CVD.

24. The method for fabricating a semiconductor device of claim 17, wherein the step of forming an organic film includes a sub-step of allowing said organic film to thermally flow.

* * * * *